(12) United States Patent
Feke et al.

(10) Patent No.: US 6,770,407 B2
(45) Date of Patent: Aug. 3, 2004

(54) METHODS FOR MONITORING PHOTORESISTS

(75) Inventors: Gilbert D. Feke, Southbridge, MA (US); Robert D. Grober, Milford, CT (US); James F. Cameron, Cambridge, MA (US); Gerhard Pohlers, Newton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/108,194

(22) Filed: Mar. 26, 2002

(65) Prior Publication Data

US 2003/0036006 A1 Feb. 20, 2003

Related U.S. Application Data

(60) Provisional application No. 60/278,903, filed on Mar. 26, 2001.

(51) Int. Cl.$^7$ .............................. G03F 9/00; G03C 5/00
(52) U.S. Cl. ......................................... 430/30; 430/330
(58) Field of Search .................................... 430/30, 330

(56) References Cited

U.S. PATENT DOCUMENTS 6,376,149 B1 * 4/2002 Grober et al. .............. 430/139

* cited by examiner

*Primary Examiner*—Christopher G. Young
(74) *Attorney, Agent, or Firm*—Peter F. Corless; Darryl P. Frickey; Edwards & Angell, LLP

(57) ABSTRACT

Methods of the invention include fluorescence microscopy inspection of an imaged resist layer prior to any type of development processing. Preferred resists for use in the methods of the invention contain a component that facilitates monitoring of a resist coating layer, particularly a component that can function as a proton acceptor and have a change in fluorescence upon exposure to radiation reemployed to pattern an image in the resist coating layer.

11 Claims, 3 Drawing Sheets

METHODS FOR MONITORING PHOTORESISTS

The present application claims the benefit of U.S. provisional application No. 60/278,903, filed on Mar. 26, 2001, which is incorporated herein by reference in its entirety.

BACKGROUND OF THE INVENTION

1. Field of the Invention

The present invention relates to new methods and systems for analyzing a variety of physical characteristics of a photoresist composition. More particularly, "in-line" analysis methods and systems are provided that can enable effective monitoring of a resist coating layer, particularly after exposure to activating radiation, but prior to any post-exposure bake or development steps. Monitoring is preferably accomplished by spectroscopic analysis of a resist coating layer, preferably by measuring fluorescence of the coating layer. Resists of the invention preferably contain a component that can facilitate monitoring, such as a proton-acceptor compound,

2. Background

Photoresists are photosensitive films used for transfer of images to a substrate. A coating layer of a photoresist is formed on a substrate and the photoresist layer is then exposed through a photomask to a source of activating radiation. The photomask has areas that arc opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition, Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Enhanced resist resolution may not be achieved by the resist composition itself. In particular, the various lithographic processing tools, the processing environment and the like all can directly impact the resolution of the processed resist.

SUMMARY OIL THE INVENTION

We now provide new methods for analysis of photoresist coating layers. Preferred methods of the invention include fluorescence microscopy inspection of an imaged resist layer prior to any type of development processing. Thus, the quality and potential resolution of a latent image patterned in the resist layer can be evaluated prior to incurring the time and expense of further processing of the resist.

Specifically preferred aspects of the invention provide fluorescence techniques for detection of latent photoacid images in photoresists, including chemically amplified resists. The results of the analysis then may be used to directly calibrate or otherwise adjust the exposure apparatus used to image to resist, thereby enabling production of developed relief images of enhanced resolution and a consistent lithographic process.

Preferred resists for use in the methods of the invention contain a component that facilitates monitoring of a resist coating layer, particularly a component that can function as a proton acceptor and exhibit a change is fluorescence upon exposure to photogenerated acid. Suitable components include aromatic compounds that have a moiety that can accept a proton such as an amine or other basic group that can serve as a proton acceptor.

Particularly preferred methods of the invention include applying a resist coating layer onto a substrate surface, e.g. a microelectronic wafer surface; exposing the applied resist layer to patterned radiation activating for the resist (e.g., generates photoacid in the resist); monitoring the exposed resist layer e.g. by spectroscopic analysis, particularly fluorescence microscopy; and thereafter further processing the resist layer as desired such as by post-exposure bake (PEB) and development steps. Additionally, if after the monitoring step the resist layer and latent relief image are unsatisfactory, the resist layer simply car be removed and the substrate re-processed, rather than conducting further, unwarranted lithographic processing.

The developed resist image also can be further analyzed if desired, e.g. by scanning electron microscopy (SEM) or the like.

As discussed above, in preferred aspects, methods of the invention provide for fluorescence detection of latent photoacid images to calibrate the focus of a projection lithography system. As discussed, the methods can be employed as a fabrication line diagnostic (specifically with regard, but not limited, to focus validation), where assessment can be conducted aver exposure step with no need to proceed through PEB and/or development.

A wide variety of photoresists can be employed in the methods of the invention. Preferred photoresists for use in the methods of the invention are chemically amplified, positive acting resists such as those resists that contain a resin with photoacid-labile groups and one or more photoacid generator compounds. Conventional positive resists also may be employed in the resists of the invention, in particular positive resists that do not contain a deblocking resin, e.g. diazonaphthoquinone photoactive component and a resin such as a novolak resin. Negative photoresists also may be employed in the methods of the invention.

Preferred photoresists for use in the methods and systems of the invention are chemically-amplified photoresists that are imaged at relatively short wavelengths such as sub-300 nm and sub-200 nm. For sub-300 nm imaging, such as 248 nm imaging, preferred photoresists include those that contain a phenolic polymer, particularly a phenolic/acrylate copolymer where the acrylate may contain photoacid-labile groups such as provided by polymerization of tert-butylacrylate or tert-butyl-methacrylate. For sub-200 nm imaging such as 193 nm imaging, preferred photoresists will contains a resin that is substantially (e.g. less than 5, 4, 3, 2 or 1 mole percent based on total polymer units) free of aromatic units such as phenyl. A particularly preferred resin for use in a resist imaged at 193 nm comprises a heteroalicyclic ring or carbon alicyclic ring (i.e. non-aromatic has all carbon ring members such as norbornyl) fused to the polymer backbone. Such photoresists disclosed in U.S. Pat. No. 6,306,554 to Barclay et al. For imaging at 157 nm, a photoresist that contains a fluorocarbon resin is preferred.

A variety of exposure wavelengths may be employed in the systems and methods of the invention, including sub-300 nm exposures such as 248 nm, and sub-200 nm exposures such as 193 nm, 157 nm and the like.

We have found that extremely small imaged features can be visualized well with methods and systems of the invention. In particular, we have found that sub-300 nm and sub-200 nm features patterned in a resist coating layer can be visualized well with the fluorescence methods of the invention.

Other aspects of the invention are disclosed infra.

BRIEF DESCRIPTION OF THE DRAWINGS

FIGS. 2C and 2D shows SEM images of the cross sections of the corresponding developed patterns.

DETAILED DESCRIPTION OF THE INVENTION

Figure 1:
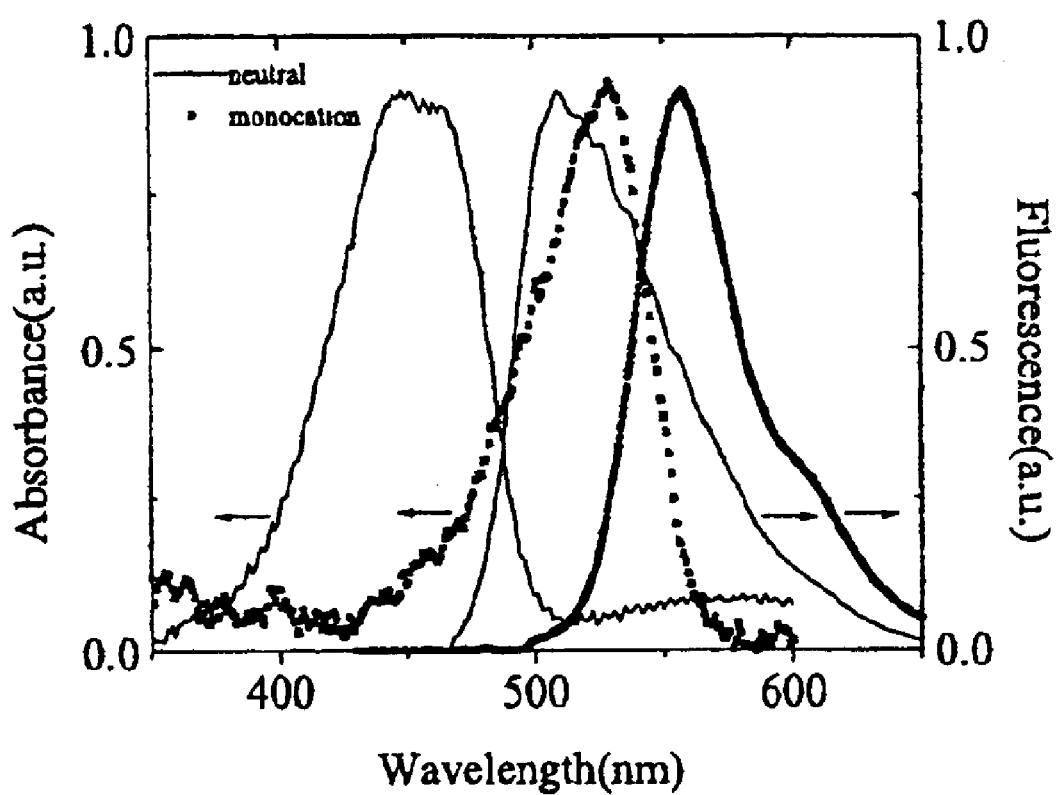
FIG. 1 shows absorption and fluorescence spectra of the unprotonated dye compound (neutral) and protontated dye (monocation) in hydroxystyrene-co-t butylacrylate polymer.

As discussed above, the invention provides fluorescence techniques and systems for detection of latent photoacid images in photoresists, including chemically amplified resists. These methods are particularly useful for focus calibration of the wafer scan stage of a projection lithography system. In accordance with the invention, fluorescence image may be used to validate the focus of exposed wafers prior to subsequent lithographic processing.

Thus, methods of the invention permit fluorescence inspection of a latent image patterned in a photoresist composition coating layer, i.e. visualization of the patterned image prior to development.

The systems and methods of the invention also can utilize fluorescence detection, which can entail use of a very small concentration of a fluorescent detection compound in a photoresist composition, e.g. less than 1 weight percent of the total solids (all components except solvent) of a photoresist composition, or even less such as less than 0.5, 0.4, 0.3. 0.2, 0.1. or 0.05 weight percent of total solids of a photoresist composition.

As discussed above, preferred resists for use in the methods of the invention contain a component that can facilitate monitoring of a resist coating layer, particularly a component that can function as a proton acceptor and have a change in fluorescence characteristics upon exposure to photoacid produced by the photoacid generator component and used to pattern an image in the resist coating layer. For instance, the photoacid can quench the existing fluorescence of the dye compound, or the photoacid can produce a detectable fluorescence of the dye compound. Suitable components include aromatic compounds that have a moiety that can accept a proton such as an amine or other basic group that can serve as a proton acceptor.

Specifically preferred monitoring components or dye components for use in methods of the invention may be single or multiple ring heteroaryl or carbocyclic aryl compounds that have one or more moieties that may function as a proton acceptor. Suitable proton acceptors include hetero atoms, particularly nitrogen atoms, and basic groups such as primary, secondary and tertiary amines. Suitable heteroaryl for use as a dye component may have 6 to about 50 ring atoms in 1 to about 3, 4, 5, 6, 7, 8, 9 or more rings and 1 to about 5 total hetero (N, O or S) ring atoms. Suitable carbocyclic aryl groups will have 6 to about 50 ring atoms and include e.g. substituted phenyl, naphtylene, anthracenyl, phenanthracenyl and the like.

Preferred dye components will have two prototropic forms with different spectroscopic properties to exhibit fluorescence contrast as a function of pH (i.e. between an acidic environment and a substantially non-acidic environment where pH differences are at least about 1, 2, 3 or 4), the fluorescence contrast between the two prototropic populations is maximal if one prototropic form may be excited or detected in some spectroscopic bandwidth without interaction with the other form (i.e., in the case where some portion of either pair of spectra do not overlap).

Specifically preferred probes to monitor photogenerated acid in photoresists for use in methods of the invention may be:

a) donor-acceptor substituted molecules where donor and acceptor are connected via a pi-electron system and where at least one of the two groups, but possibly both, may function as proton acceptor. Suitable donor moieties are the following groups; N,N-dialkylamino, amino, alkoxy, thioalkoxy, hydroxy, thiohydroxy. Preferred acceptor groups are: nitro, cyano, trifluoromethyl, —SO$_2$R (R=NH$_2$, alkyl, arylCF$_3$), —CHO, —CO$_2$R (R=H, alkyl, aryl), benzothiazolyl, pyridyl.

Some specific examples of preferred dye compounds for use in resists of the invention include the following:

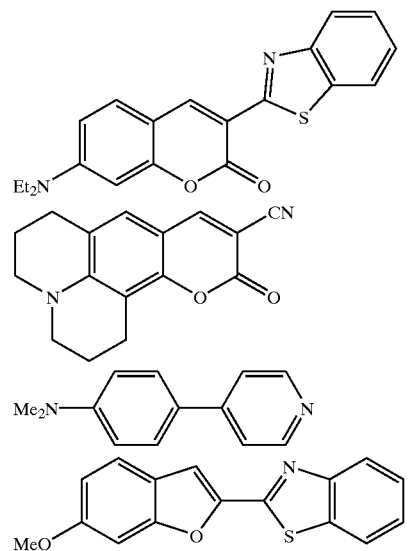

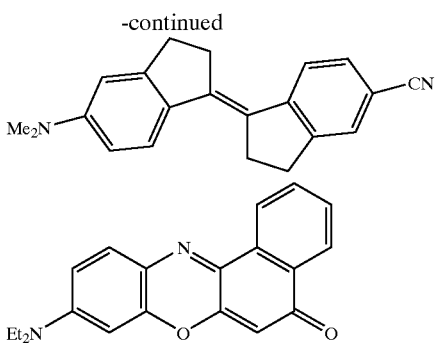

b) A compound that undergoes a significant change in molecular framework (and thereby its spectral characteristics) upon protonation, such as substituted naphthopyrans and rhodamine dyes, e.g.

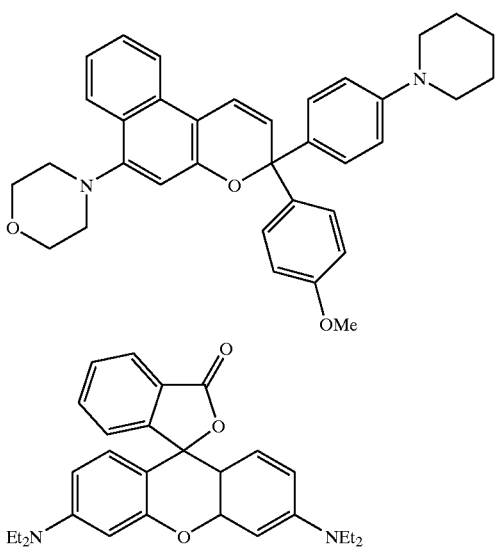

In addition to such a dye component, photoresists for use in the methods of the invention also in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for use in resists employed in methods of the invention include imidosulfonates; other sulfonate compounds such as those disclosed in European Patent Application 96118111.2 (publication number 0783136); and other known FAGS also may be employed in the resists of the invention, including PAGs disclosed in U.S. Pat. Nos. 6,042,997 and 5,492,793, A variety of resins may be employed in the resists of the invention, including polymers that contain phenolic units, particularly where copolymerized with acrylate units, e.g. photoacid labile acrylate groups such as t-butyl acrylate and t-butylmethacrylate. See also U.S. Pat. Nos. 6,042,997 and 5,492,793, where useful resist polymers are disclosed.

Other useful resist polymers and resists for use in methods of the invention are disclosed in U.S. Pat. Nos. 5,929,176; 6,090,526; 6,048,664; and 5,843,624.

Resists of the invention may contain additional components. A preferred optional additive of resists of the invention is an added base such as an alkyl ammonium salt. The added base is suitably used in relatively small amounts, e.g. about 0.03 to 5 percent by weight relative to the total solids. Other suitable components include anti-striation agents, plasticizers, speed enhancers, etc.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images.

The compositions of the invention are used in accordance with generally known procedures. The liquid coating compositions of the invention are applied to a substrate such as by spinning or other coating technique.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Resists of the invention also may be applied over an anti-reflective layer, particularly an organic antireflective layer.

Following coating of. the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength, e.g. 248 nm, 193 nm or 157 nm, The resist compositions of the invention also may be suitably imaged at higher wavelengths such as 365 nm.

After exposure, the resist may be analyzed in accordance with the invention as described above. Preferred analysis methods are disclosed in the examples which follow.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide Following development of the photoresist coating over the substrate, the developed substrate may be selectively processed on those areas bared of resist, for example by chemically etching or plating substrate areas bared of resist in accordance with procedures known in the art.

All documents mentioned herein are incorporated herein by reference. The following non-limiting examples are illustrative of the invention.

EXAMPLE 1

Calibration Methods in Accordance with the Invention

To a commercially available positive tone, chemically amplified photoresist (UVIII available from the Shipley Co.) was added a dye compound of coumarin 6.

Two formulations were prepared for spectroscopic analysis: Resist A and Resist B. In each of Resists A and B, the coumarin 6 compound was present in an amount of 1 weight percent total solids. Additionally, camphorsulfonic acid was added to Resist A until the formulation was observed by the naked eye to change color from green to orange. Hence, Resist A contained the coumarin 6 compound is protonated form and Resist B contained the courmarin 6 compound in unprotontated form. Each formulation applied by spin coating to a thickness of approximately 0.7 $\mu$m on a 1 in. quartz wafer and received a post-application bake (PAB) at 130° C. for 60 s.

Spectroscopic filters are used for exciting and imaging the dye-doped resist.

Absorption spectra were recorded using a Varian CARY 13 spectrophotometer. Fluorescence spectra were obtained from the identical samples as the absorption spectra using an apparatus based on a Triplemate monochrometer (Instruments S. A., Inc., Edison, N.J.). Resist A was excited with 488.0 nm light from an Ar-ion laser (a wavelength which would be significantly absorbed by the dye yet would not overlap with the expected fluorescence spectrum). Resist B was excited with 457.9 nm light (also a wavelength which would be significantly absorbed by the dye yet would not overlap with the expected fluorescence spectrum, as well as the shortest possible wavelength from the laser). Both the absorption and the fluorescence spectra are shown in FIG. 1. The red shifts between the unprotonated coumarin 6 compound of Resist B and the protonated courmarin 6 compound of Resist A are so large that little overlap exists between each pair.

The apparatus used for detecting latent photoacid images is based on a Zeiss Axioskop 50 microscope operated in epi-fluorescence mode. The spectroscopic filters were chosen to excite and detect the neutral population of the dye exclusively. Light from a 75 W xenon arc lamp is transmitted through a ground glass diffuser and a 457.9.+5 nm excitation filter, reflected by a 497 nm long pass dichroic beam splitter, and imaged onto the sample with a dry, 0.9 numerical aperture, 100×, infinity corrected microscope objective. Dry microscopy permits non-contact inspection, a necessity for a potential fabrication line diagnostic tool. The fluorescence is collected by the objective, transmitted through the dichroic beam splitter, a 500 nm long pass filter, a 515±5 nm filter, and imaged onto a liquid nitrogen cooled 512×512 array 24×24 $\mu$m pixel charge coupled device camera with 16 bit resolution by a combination of the microscope tube lens and a negative lens for additional magnification (a total of 492×). As can be seen in FIG. 1, the protonated courmarin 6 population is very weakly excited by light at 457.9 nm and is very weakly fluorescent between 500 nm and 530 run. This choice of filters therefore provides detection of courmarin 6 with very good contrast. Images were acquired using an integration time of 30 s in order to use a substantial fraction of the dynamic range of the camera (with the given excitation intensity). To achieve the best focus in the fluorescence microscope prior to image acquisition, the field diaphragm was closed partially and the sample stage was adjusted until the sharpest image of the field diaphragm edge was obtained,

EXAMPLE 2

Focus Calibration

A formulation of the same chemically amplified resist as Resist B but doped with 0.05 wt % of the coumarin 6 compound was prepared for focus calibration. Films were coated to a thickness of approximately 0.75 $\mu$m onto two 8 in, silicon wafers each pre-coated with an organic antireflective layer and received PABs at 130° C. for 60 seconds. Each of the wafers was exposed with a binary image mask consisting of various features using a GCA XLS 7800 projection lithography system. Since the field of view of the system is much smaller than the wafer area, the exposure was repeated at different positions on each of the wafers as the focus was ramped through a range of 2.4 $\mu$m in increments of 0.15 $\mu$m (a total of seventeen samples). One of the wafers received a PEE at 130° C. for 90 seconds was developed using an aqueous alkaline developer (Shipley Co.), and underwent SEM analysis. The other wafer underwent fluorescence analysis directly after exposure.

Figure 2:
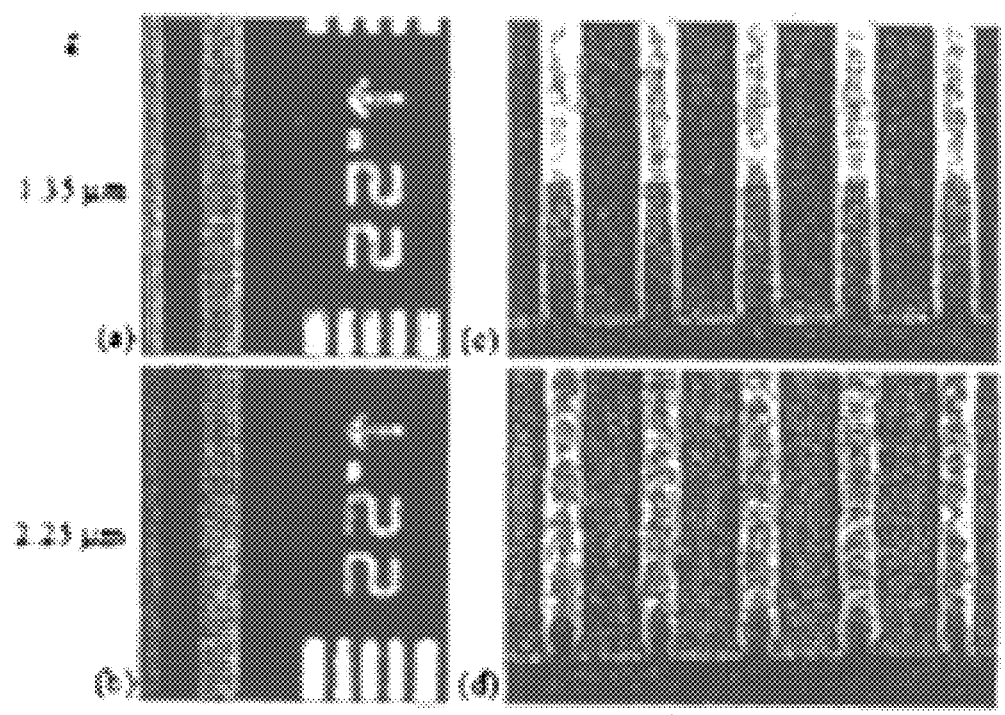
FIG. 2 (which includes FIGS. 2A through 2D) shows at FIGS. 2A and 2B fluorescence images of 0.22 μm lines at 0.44 μm pitch exposed at focus increment z 1.35 μm and 2.25 μm, respectively.

The features chosen for focus calibration were an. array of seven 0.22 $\mu$m lines at 0.44 $\mu$m pitch. Seventeen fluorescence images of these features were acquired, one for each focus increment (z). Two representative fluorescence images are shown in FIG. 2: (a) z=1.35 $\mu$m, and (b) z=2.25 $\mu$m (where z=0 is the beginning of the focus ramp). Because the spectroscopic filters were chosen to detect the neutral population of the dye, the regions of high intensity identify unexposed resist (i.e., regions of low acid concentration). The contrast of the fluorescence image at z=2.25 $\mu$m is significantly less than that at z=1.35 $\mu$m due to a weaker modulation of acid concentration, which indicates that the z=1.35 $\mu$m image is in better focus.

SEM images of the cross sections of the developed features were acquired for each focus increment as well; those corresponding to FIG. 2(a) and (b) are shown in FIG. 2(c) and (d). Because the resist is positive-tone, the areas where the resist is present identify unexposed resist (i.e. regions without acid catalyzed dissolution enhancement, corresponding to opaque regions on the mask). Whereas the developed pattern at z=1.35 um exhibits excellent quality, those at z=2.25 $\mu$m exhibit significant top-loss due to partial acid catalysis.

Figure 3:
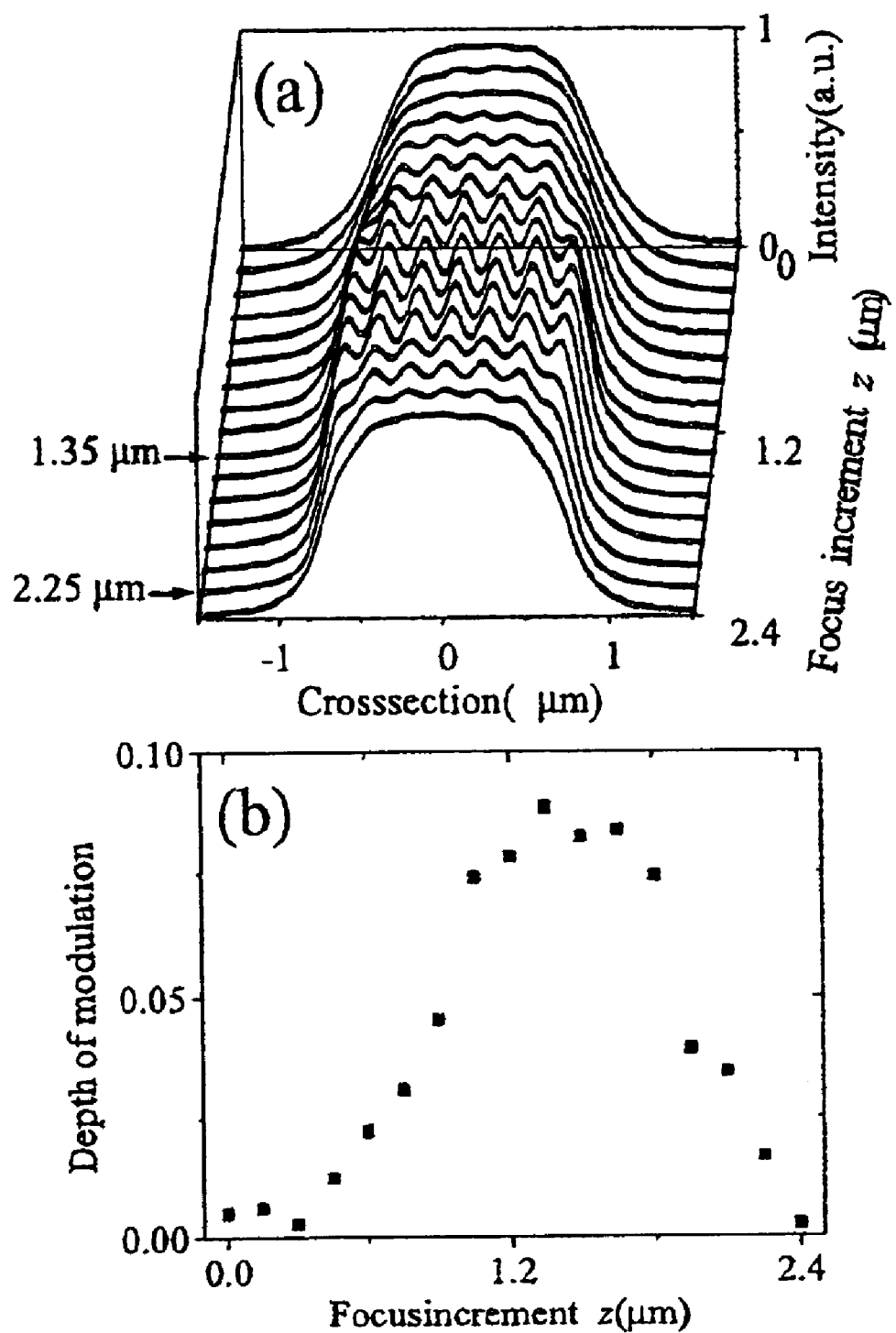
FIG. 3 (which includes FIGS. 3A and 3B) shows at FIG. 3(a) cross sections of the fluorescence images as a function of focus increment z, and FIG. 3(b) depth of modulation (calculated from the cross sections in (a)) vs focus increment z.

Fluorescence cross sections of each of the seventeen images are shown in FIG. 3. Arrows indicate the cross sections of the z=1.35 $\mu$m and z=2.25 $\mu$m images. The data between the center three lines was fit with the function $$a\sin(kx+\phi)+h+b, \quad (1)$$

where a (amplitude), k (spatial frequency), x (cross sectional position), $\phi$ (phase), and h (offset) were free parameters, and b was a fixed parameter (the value of the baseline fluorescence in the exposed region). The depth of modulation $$DOM=a/h \quad (2)$$

was calculated for each of the cross sections and is shown as a function of z in FIG. 4. The data fall within two distinct groups: whereas the DOM for 1.05 $\mu$m<z<1.80 $\mu$m is larger than 0.074, the DOM for z<0.90 $\mu$m and z>1.95 $\mu$m is less than 0.046. The data therefore suggests that the wafer scan stage of the projection lithography system achieves best focus for 1.05 $\mu$m<z<1.80 $\mu$m, and that the depth of focus of the system is 1.80 $\mu$m–1.05 $\mu$m=0.75 $\mu$m.

The focus latitude (FL) of a resist is defined as the focus range through which a given feature develops with a linewidth within +10% of the target linewidth and with less than 10% top loss. FL is a function of the properties of the resist as well as the depth of focus of the projection lithography system. The FL of this resist (for 0.221 cm lines) was calculated from the SEM images to be 0.90 µm (from z=0.90 µM to z=1.80 em). This result agrees well with that found from the fluorescence method. Therefore, the fluorescence method provides a robust calibration of the focus of the wafer scan stage, as well as a means to validate whether an exposure was indeed in focus before proceeding through PEB and development.

EXAMPLE 3

193 nm Resist

A photoresist containing a resin that contains polymerized units of tetrahydropyran, norbornene, maleic anhydride and 2-methyladamantly methacrylate, a photoacid generator of triphenylsulfonium perfluorobutane sulfonate, a basic additive of tetrabutylammonium lactate, a dye compound of coumarin 6 and a solvent of ethyl lactate was spin-coated onto a silicon wafer substrate, soft-baked and exposed through to patterned 193 nm radiation to provide a latent image of 140 nm features that were visualized by fluorescence through a microscope tool.

The foregoing description of the invention is merely illustrative thereof, and it is understood that variations and modification can be made without departing from the spirit or scope of the invention as set forth in the following claims.

What is claimed is:

1. A method for adjusting a photoresist exposure apparatus, comprising:

exposing a photoresist coating layer to patterned activating radiation to form a latent relief image;

analyzing flouresence of the latent image prior to post-exposure thermal treatment or development of the resist coating layer; and adjusting the photoresist exposure apparatus to a desired level based on the analysis of the latent image.

2. The method of claim 1 wherein the focus of the exposure apparatus is calibrated based on the analysis of the latent image.

3. The method of claim 1 wherein the latent image is analyzed by spectroscopy or microscopy.

4. The method of claim 1 wherein the photoresist is a chemically amplified resist.

5. The method of claim 1 wherein the photoresist is a positive-acting resist.

6. The method of claim 1 wherein the photoresist is a negative- acting resist.

7. The method of claim 1 wherein the photoresist comprises a component that that has a modulation in fluorescence in the presence of photoacid.

8. The method of claim 1 wherein the photoresist comprises a component, separate from a photoacid generator compound, that is responsive to photoacid used to form a relief image expose the photoresist layer.

9. The method of claim 8 wherein the component separate from the photoacid generator compound is a proton acceptor.

10. The method of claim 8 wherein the component separate from the photoacid generator compound is an aromatic compound.

11. The method of claim 8 wherein after adjusting the exposure apparatus the photoresist coating layer is thermally treated and developed to provide a relief image.

* * * * *